United States Patent
Chopra et al.

(10) Patent No.: US 7,109,112 B2
(45) Date of Patent: Sep. 19, 2006

(54) METHOD OF PROVIDING A STRUCTURE USING SELF-ALIGNED FEATURES

(75) Inventors: Dinesh Chopra, Boise, ID (US); Kevin G. Donohoe, Boise, ID (US); Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 167 days.

(21) Appl. No.: 10/860,939

(22) Filed: Jun. 3, 2004

(65) Prior Publication Data

US 2004/0219738 A1 Nov. 4, 2004

Related U.S. Application Data

(60) Continuation of application No. 10/295,536, filed on Nov. 15, 2002, now Pat. No. 6,759,330, which is a division of application No. 09/644,254, filed on Aug. 22, 2000, now Pat. No. 6,511,912.

(51) Int. Cl.
*H01L 21/44* (2006.01)
(52) U.S. Cl. ....................... 438/674; 438/687
(58) Field of Classification Search ............... 438/643, 438/674, 687
See application file for complete search history.

(56) References Cited

U.S. PATENT DOCUMENTS

| | | | |
|---|---|---|---|
| 5,011,580 A | 4/1991 | Pan et al. | |
| 5,071,518 A | 12/1991 | Pan | |
| 5,242,861 A | 9/1993 | Inaba | |
| 5,266,526 A | 11/1993 | Aoyama et al. | |
| 5,348,811 A | 9/1994 | Nagao et al. | |
| 5,723,387 A | 3/1998 | Chen | |
| 5,766,492 A | 6/1998 | Sadahisa et al. | |
| 5,821,168 A | 10/1998 | Jain | |
| 5,930,669 A | 7/1999 | Uzoh | |
| 5,968,333 A | 10/1999 | Nogami et al. | |
| 5,969,422 A | 10/1999 | Ting et al. | |
| 6,080,656 A | 6/2000 | Shih et al. | 438/626 |
| 6,083,815 A | 7/2000 | Tsai et al. | 438/585 |
| 6,136,707 A * | 10/2000 | Cohen | 438/687 |
| 6,162,728 A * | 12/2000 | Tsao et al. | 438/687 |
| 6,168,704 B1 | 1/2001 | Brown et al. | 205/118 |
| 6,187,656 B1 | 2/2001 | Lu et al. | |
| 6,197,688 B1 | 3/2001 | Simpson | |
| 6,207,558 B1 | 3/2001 | Singhvi et al. | |
| 6,245,662 B1 | 6/2001 | Naik et al. | |
| 6,251,781 B1 | 6/2001 | Zhou et al. | |
| 6,291,332 B1 | 9/2001 | Yu et al. | 438/618 |
| 6,303,498 B1 | 10/2001 | Chen et al. | |
| 6,365,511 B1 | 4/2002 | Kizilyalli et al. | |

(Continued)

*Primary Examiner*—Tuan H. Nguyen
(74) *Attorney, Agent, or Firm*—Schwegman, Lundberg, Woessner & Kluth, P.A.

(57) ABSTRACT

In a copper plating process, a seed layer is uniformly deposited over a surface, including lining a high aspect ratio trench defined by that surface. A mask layer is provided using a process that fails to deposit in the trench. In one exemplary embodiment, the failure is due to the decrease in the isotropic flux of neutrals toward the bottom of the trench. Copper is subsequently electroplated. Because the seed layer is exposed only within the trench, copper deposits only therein. The self-aligned mask prevents plating outside of the trench. A chemical-mechanical planarization step removes the mask and the seed layer extending beyond the trench, leaving a copper structure within the trench. The structure may serve as a conductive line, an interconnect, or a capacitor plate.

22 Claims, 9 Drawing Sheets

U.S. PATENT DOCUMENTS

| | | |
|---|---|---|
| 6,372,622 B1 | 4/2002 | Tan et al. |
| 6,391,769 B1 | 5/2002 | Lee et al. .................. 438/643 |
| 6,403,481 B1 | 6/2002 | Matsuda et al. |
| 6,413,858 B1 | 7/2002 | Chopra |
| 6,420,258 B1 | 7/2002 | Chen et al. .................. 438/622 |
| 6,420,262 B1 | 7/2002 | Farrar |
| 6,489,235 B1 | 12/2002 | Gilton et al. |
| 6,545,357 B1 | 4/2003 | Chopra |
| 6,614,099 B1 | 9/2003 | Farrar |
| 6,696,746 B1 | 2/2004 | Farrar et al. |
| 6,756,301 B1 | 6/2004 | Gilton et al. |
| 6,759,330 B1 | 7/2004 | Chopra et al. |
| 6,852,618 B1 | 2/2005 | Chopra |
| 6,946,389 B1 | 9/2005 | Farrar et al. |
| 2002/0127845 A1 | 9/2002 | Farrar |
| 2002/0142583 A1 | 10/2002 | Chopra |
| 2004/0219738 A1 | 11/2004 | Chopra et al. |
| 2005/0023697 A1 | 2/2005 | Ahn |

* cited by examiner

METHOD OF PROVIDING A STRUCTURE USING SELF-ALIGNED FEATURES

RELATED APPLICATION

This application is a continuation of U.S. application Ser. No. 10/295,536, filed Nov. 15, 2002 and issued as U.S. Pat. No. 6,759,330; which is a divisional of U.S. App. Ser. No. 09/644,254, filed Aug. 22, 2000 and issued as U.S. Pat. No. 6,511,912.

TECHNICAL FIELD

The present invention relates generally to a method of fabricating semiconductor devices. More particularly, the present invention relates to a method of self-aligned plating of copper.

BACKGROUND OF THE INVENTION

In fabricating a semiconductor device, it may be desirable to include copper as part of the device due to copper's low resistivity and ability to carry high current densities. Unfortunately, the use of copper is somewhat problematic. For instance, attempting to deposit a relatively large amount of copper directly onto a dielectric material results in poor adhesion. This can be particularly troublesome if the underlying surface has a variable topography, such as an insulating surface defining a trench. Assuming that it is desirable to fill the trench with copper, one known method of accomplishing this task is to first line the trench with a seed layer, which provides nucleation sites for the subsequent formation of copper. Known materials for such a seed layer include copper itself or aluminum. One known method of depositing the seed layer is physical vapor deposition (PVD). Such a process, however, not only lines the trench but also deposits the seed layer on surfaces outside of the trench.

Once the seed layer has been deposited, copper is then provided using one of several methods, such as electroplating. In that method, the in-process semiconductor device, which may still be part of an undiced semiconductor wafer, is exposed to a solution containing ions of the metal to be deposited. The wafer serves as the cathode and is connected at its edges to a negative terminal of a power supply. A suitable anode is also exposed to the solution and is connected to a positive terminal of the power supply. The power supply generates an electrical current which flows between the anode and the cathode through the solution. The electrical current causes an electrochemical reaction at the surface of the wafer, resulting in the metal ions in the solution being deposited thereon. Electroless deposition is also another option, wherein deposition occurs in an aqueous medium through an exchange reaction between metal complexes in solution and the particular metal to be coated; and an externally applied electric current is not required.

Regardless of the precise deposition process chosen, it is noteworthy that copper will deposit wherever the seed layer is exposed, including outside of the trenches, where copper is not necessarily desired. Thus, the excess copper must be removed using a process such as chemical-mechanical planarization (CMP). Doing so, however, may require multiple CMP steps depending upon the amount of excess copper to be removed and the presence of other layers, such as a barrier layer. This runs counter to the general desire in the art, which favors a minimum number of process steps, minimal process time, and the minimal use of materials such as CMP slurry and copper. In addition, attempts to remove the copper outside of the trench using CMP risks the phenomenon known as "dishing" concerning the copper remaining in the trench. This undesirable effect is further discussed in U.S. Pat. No. 6,080,656 by Shih et al. (hereinafter Shih).

Shih also proposes a solution to the dishing problem. After depositing a copper seed layer over a dielectric layer defining a trench, Shih proposes depositing a continuous insulating layer over the dielectric layer. Shih then patterns the insulating layer using photolithography in order to remove the portions of insulating material over the trench. Shih suggests using the same photo mask used to define the trench in the dielectric. Ideally, only the portion of the seed layer within the trenches remains exposed as a result of this process. Copper is subsequently electroplated and, because the portion of the seed layer external to the trench is covered by the insulating layer, plating does not occur in that location. Rather, plating is limited to the trenches. The purported result is a relatively easier CMP process that need only remove a small amount of copper, the insulating layer, and the seed layer. However, Shih's process requires that the photolithography step used to pattern the insulating layer be in perfect alignment with the photolithography step used to define the trenches in the dielectric. Otherwise, copper will form outside of the trench and copper formation inside the trench will be hindered. Moreover, assuming that such alignment is achieved, Shih's process still requires additional lithography and etching steps. As discussed above, there is an ever-present desire in the art to minimize the number of process steps needed to fabricate a semiconductor device.

Other fabrication problems occur in another, seemingly unrelated, area of semiconductor device fabrication; namely, plasma-assisted deposition processes such as plasma-enhanced chemical vapor deposition (PECVD). Ideally, generating a plasma as part of the deposition process results in neutral particles that enhance deposition upon the surface of a workpiece. However, even with the enhancement that a plasma process provides, other factors may interfere with deposition. One such factor is the aspect ratio defined by a portion of the surface. The aspect ratio is defined as the depth of a feature divided by the width of a feature. If the surface defines a feature with a high aspect ratio, such as a deep trench with a narrow width, it is theorized that the isotropic flux of neutrals will decrease within the trench, thereby preventing deposition therein. In some circumstances, deposition does not occur at all within the trench.

This non-conformal deposition is an undesirable result in many instances of fabrication. For example, there are efforts in the art to use a plasma process in order to deposit polymer on the sidewalls of a trench. Doing so allows a decrease in a dimension of a feature. As a result, there are efforts by those skilled in the art to change the plasma-enhanced deposition process to allow a more uniform deposition.

SUMMARY OF THE INVENTION

Exemplary embodiments of the current invention, however, embrace the problem of decreasing isotropic flux in a high aspect ratio feature by using that phenomena to solve the copper plating problem. First, an in-process semiconductor device is provided. The device comprises a material defining a trench and a seed layer over the material. In one exemplary embodiment of the current invention, a plasma process is used to deposit a non-conformal mask onto the seed layer. The mask is non-conformal in that it does not deposit inside the trench. Hence, the seed layer therein is exposed. The mask does cover portions of the seed layer outside of the trench. As a result, a subsequent plating process deposits a conductive material only inside of the trench. A CMP step removes the mask and seed layer external to the trench.

Alternative exemplary embodiments of the current invention involve the use of phenomena other than decreasing isotropic flux in a high aspect ratio feature to provide an appropriate non-conformal mask layer. Still other embodiments concern the provision of materials other than copper.

In addition, exemplary embodiments of the current invention address the application of this process in at least one of several stages of semiconductor device fabrication, including forming a conductive line predominantly at one elevation of a semiconductor device, providing electrical communication between different elevations of a semiconductor device, and forming at least one capacitor electrode.

DETAILED DESCRIPTION OF THE INVENTION

Figure 1:
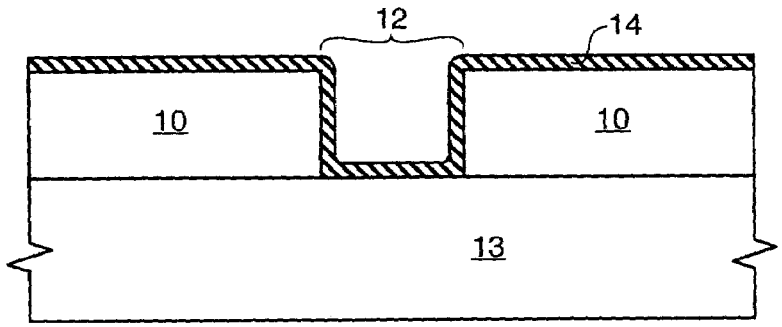
FIGS. 1–4 are cross-sectional views of an in-process semiconductor device depicting an exemplary process within the scope of the current invention.

FIG. 1 illustrates an in-process semiconductor device as known in the art, wherein an oxide 10 defines a trench 12, and a continuous seed layer 14 about 1000 angstroms thick has been deposited thereover. It is preferred that the trench define an aspect ratio of greater than 0.5. The oxide 10 is over a semiconductor substrate 13. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above. Moreover, it is understood that a semiconductor device may comprise conductive and insulative materials as well as a semiconductive material.

For purposes of explanation, it is assumed that it is desired to fill the trench with copper. Accordingly, it is further assumed that the seed layer comprises copper and was deposited by a PVD process, as is known in the art. As discussed above, prior art teaches either subsequently (1) plating over the entire surface, including outside of the trench; or (2) layering insulation over the entire surface and subsequently patterning that layer in an attempt to expose only the trench to the plating process.

Figure 2:
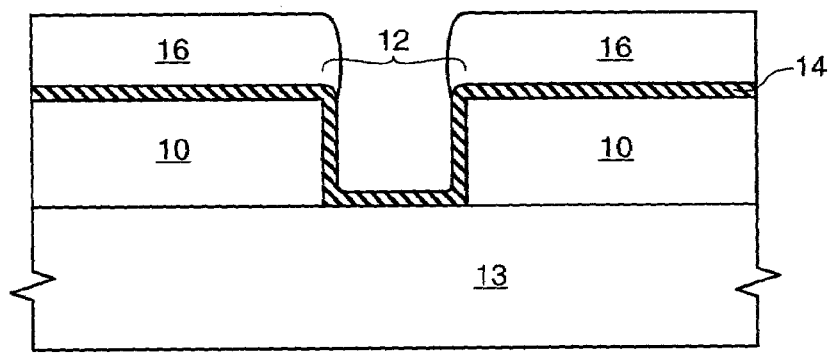

At least one exemplary embodiment of the current invention, however, avoids both plating outside of the trench and having to pattern a material over the seed layer. Instead, a material 16 is deposited over the seed layer under parameters such that the material 16 avoids the trench 12. The result of such a deposition is illustrated in FIG. 2. The material 16 is one that is capable of surviving a subsequent process that adds to the inside of the trench 12. Again, for purposes of explaining the current invention, it is assumed that the subsequent process is a plating process. Accordingly, material 16 could be a dielectric. More specific examples of material 16 include one comprising a hydrocarbon, a fluorocarbon, or a fluorohydrocarbon. Assuming that material 16 is a dielectric such as a fluorocarbon polymer film, an exemplary deposition process that avoids the trench 12 can occur in an IPS etcher manufactured by Applied Materials, Inc. Exemplary parameters include introducing $CH_2F_2$ gas at a flow rate ranging from 20–60 sccm, preferably 40 sccm; a pressure ranging from 1 to 40 mTorr, preferably 25 mTorr; a source power ranging from 600 W to 1500 W, preferably 1000 W; a bias power of about 0 W; a roof temperature of about 140° C.; and an outer ring temperature of about 200° C.

Figure 3:
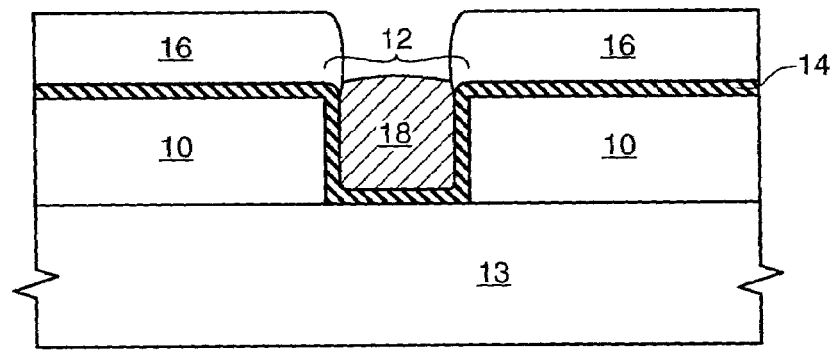

Once the in-process device illustrated in FIG. 2 is achieved, the plating process mentioned above is carried out. In an exemplary plating process, electrical contact is made with the seed layer 14 at the edge of the wafer, wherein the wafer has a face on which the semiconductor device is being formed. The wafer is placed face-down at the opening of a tank filled with a liquid comprising copper sulfate, sulfuric acid, hydrochloric acid, and organic additives. The wafer serves as a cathode, and an anode is found within the tank. The anode and cathode are 1 to 5 cm apart, preferably 3 cm. The liquid in the tank flows from the bottom of the tank, around the anode, toward the tank opening where the wafer is located, and spills out of the tank after contacting the wafer's face. The flow rate of the liquid ranges from 2 to 7 gallons per minute (gpm), preferably 5.5 gpm. A current ranging from 2 to 8 amps is generated for 1 to 7 minutes. Preferably, a current of 4 to 5 amps is generated for 1 minute, and a current of 6 amps is subsequently generated for 3 minutes. The waveform can be a pulse, direct current (DC), or a reverse pulse waveform; preferably a DC waveform is used. The wafer is rotated at a rate of 20 to 70 rotations per minute (rpm), preferably 40 rpm. The result of this process is illustrated in FIG. 3, wherein copper 18 plates the trench 12 but does not plate outside of the trench 12 because material 16 was deposited in such a manner so as to isolate a portion of the seed layer 14 external to the trench 12 from the plating fluid.

Figure 4:
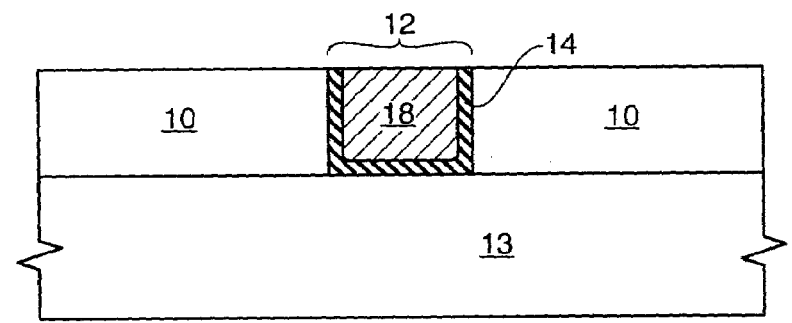

A removal step, such as CMP, may then be used to remove the material 16 and the seed layer 14 external to the trench 12, resulting in the structure appearing in FIG. 4. Exemplary CMP parameters include applying a pressure of 2 to 5 pounds per square inch (psi) against the wafer, preferably 3 psi; a pad rotation rate ranging from 30 to 100 rpm, preferably 80 rpm; a wafer rotation rate ranging from 30 to 100 rpm, preferably 80 rpm; a slurry flow rate ranging from 50 to 200 milliliters per minute, preferably 100 milliliters per minute; and a temperature ranging from 70 to 130° F., preferably 77° F. The slurry itself comprises an abrasive such as $SiO_2$, $Al_2O_3$, $TiO_2$, or $CeO_2$; $Al_2O_3$ is preferable. The slurry may also contain an oxidizer such as $H_2O_2$, $KIO_3$, $FeNO_3$, ammonium persulfate, or ammonium molybdate; $H_2O_2$ is preferable. The pH of the slurry can range from 2 to 10 and is preferably 7. The CMP continues until the material 16 and the seed layer 14 external to the trench 12 are removed. An exemplary time required for such a result is 60 seconds. One skilled in the art can now appreciate that removing material 16 and seed layer 14 is preferable to removing a relatively thick layer of plated copper in terms of process time, amount of slurry used, and amount of copper wasted.

The basic process disclosed above can have applications at several stages during semiconductor device fabrication. Such stages include word line, bit line, plug, and interconnect formation. Exemplary embodiments of the current invention include within their scope those comprising one such stage, combinations of such stages, and all stages.

Figure 5:
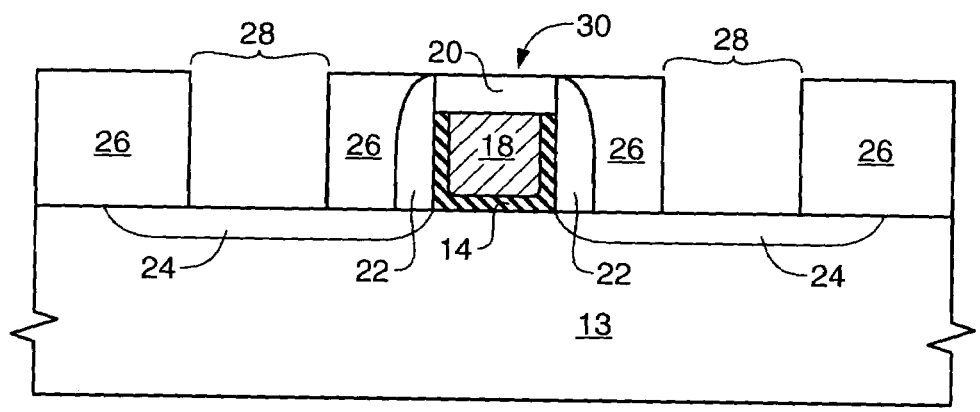
FIG. 5 is a cross-sectional view of an in-process semiconductor device depicting an application of an exemplary process within the scope of the current invention.

For instance, the entrenched copper 18 of FIG. 4 could serve as a word line/transistor gate 30, as seen in FIG. 5, by removing the oxide 10 and adding an oxide or nitride cap 20, adding dielectric spacers 22, and defining active areas 24 using a doping process. Subsequent fabrication steps involve providing a second oxide 26 and etching openings 28 in the second oxide 26 down to the active areas 24. At this stage, it is desired to fill the openings 28 with a material that will allow electrical communication between the active areas 24 and conductive structures to be provided over the second oxide 26.

Figure 6:
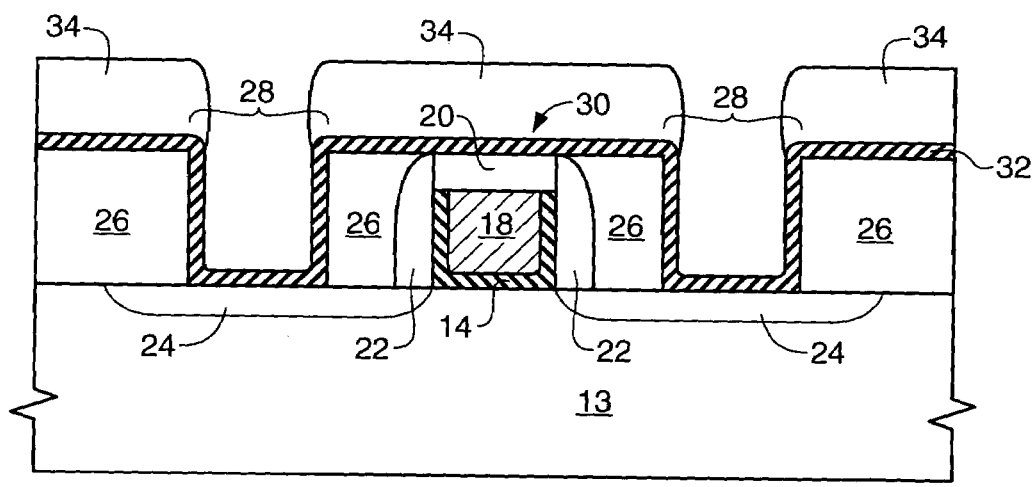
FIGS. 6–8 are cross-sectional views of an in-process semiconductor device depicting another exemplary process within the scope of the current invention.
Figure 7:
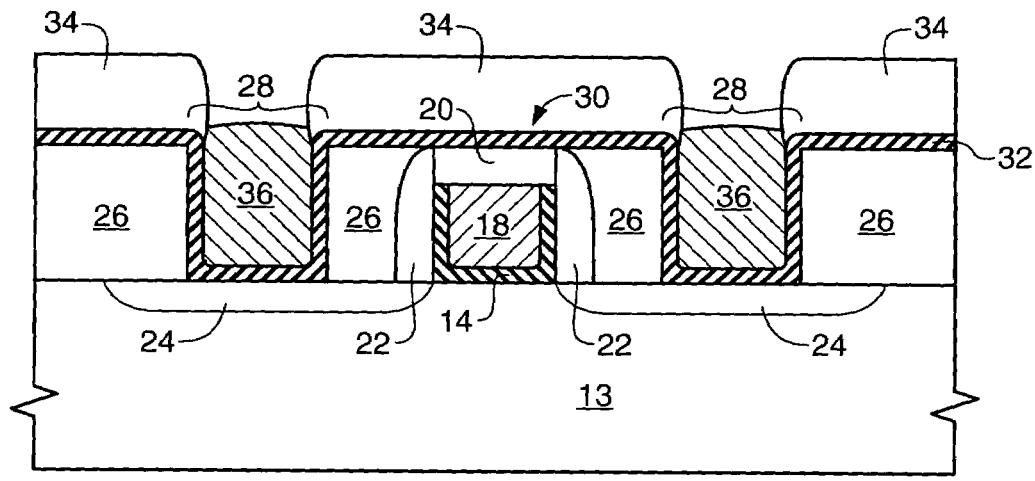
Figure 8:
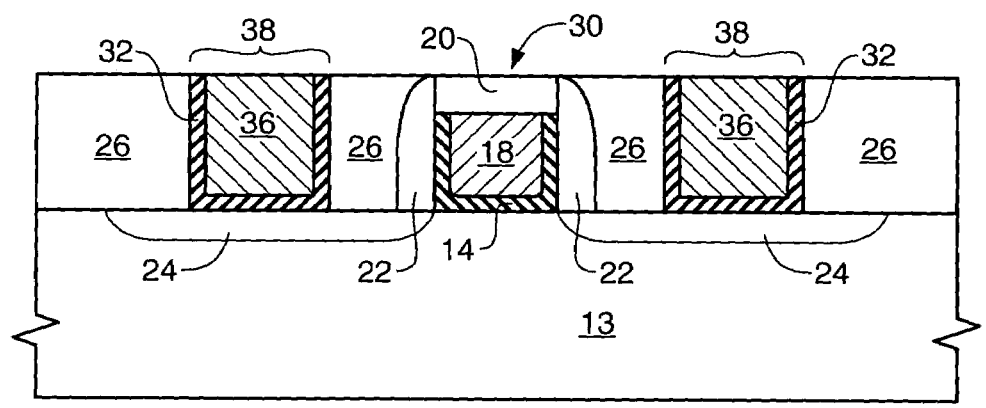

The conductive structures that fill the openings and allow such communication are often referred to as "plugs" and can be formed in a manner similar to that used to form the transistor gate 30. As seen in FIG. 6, a second seed layer 32 is provided over the second oxide 26, and a second dielectric 34 is deposited in a manner so as to avoid portions of the seed layer 32 lining the openings 28. As seen in FIG. 7, a plating process or some other deposition method is used to deposit an electrically conductive material 36 only on the exposed portions of seed layer 32. A subsequent CMP step can be used to remove the second dielectric 34 and portions of the second seed layer 32 external to the openings 28, resulting in the in-process device including plugs 38 seen in FIG. 8.

Figure 9:
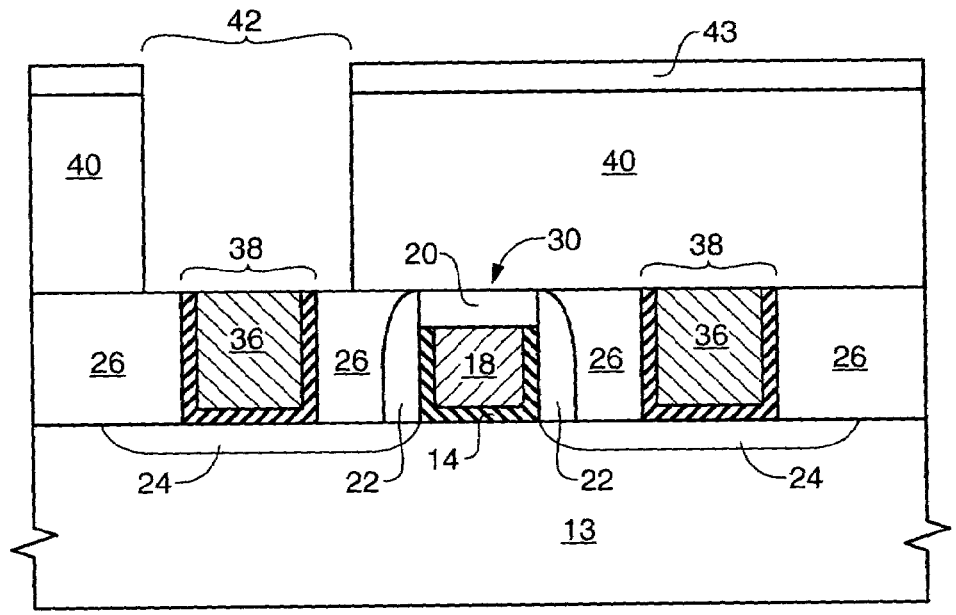
FIGS. 9–12 are cross-sectional views of an in-process semiconductor device depicting yet another exemplary process within the scope of the current invention.
Figure 10:
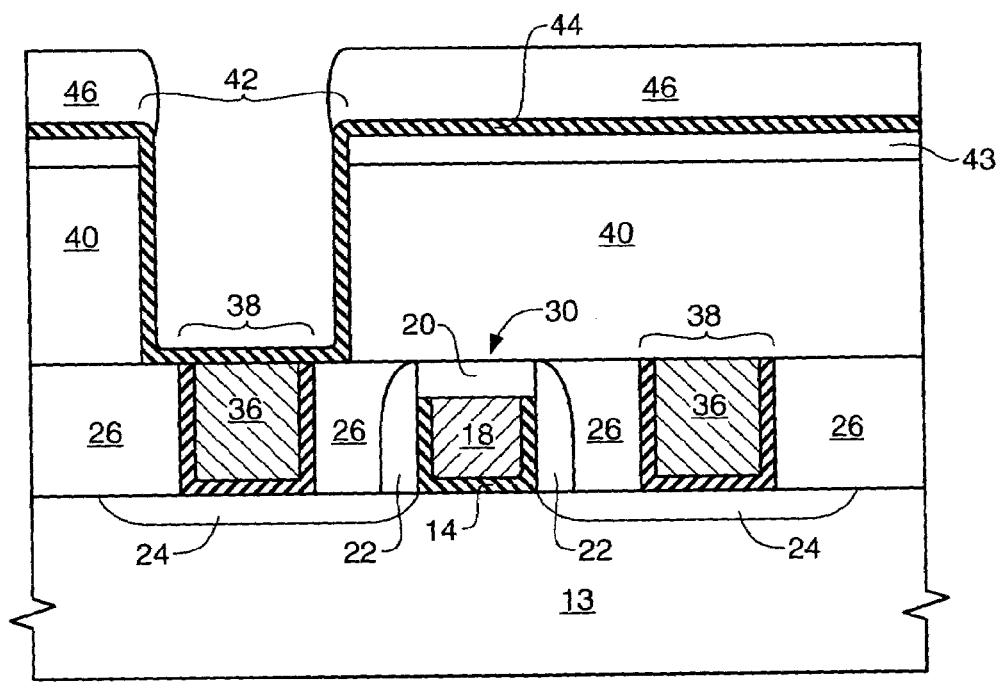
Figure 11:
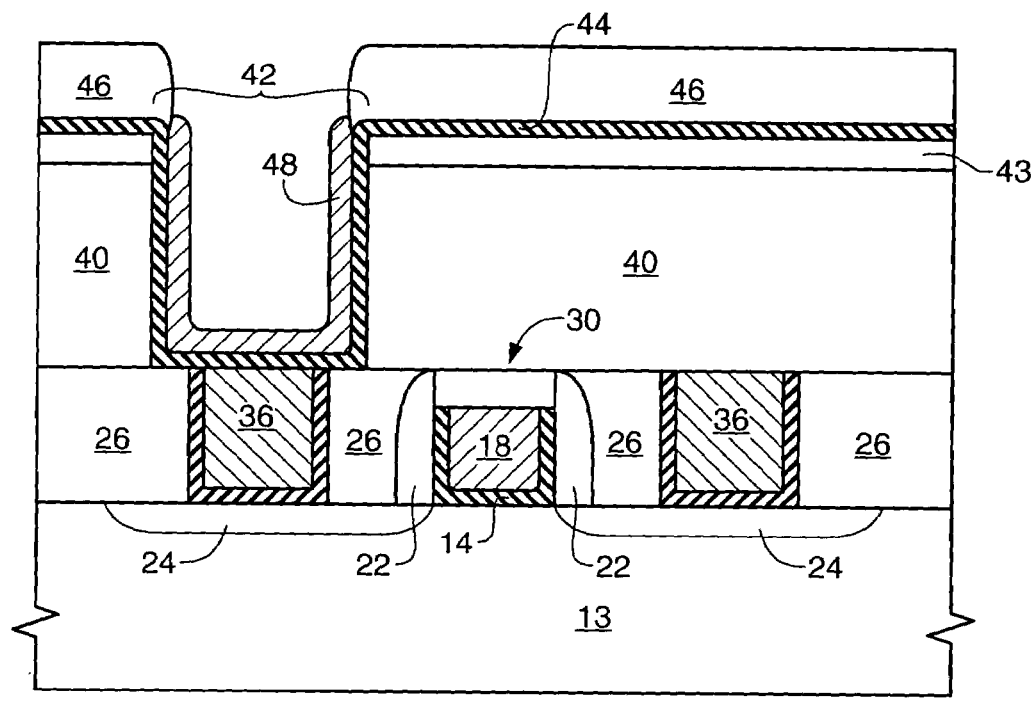
Figure 12:
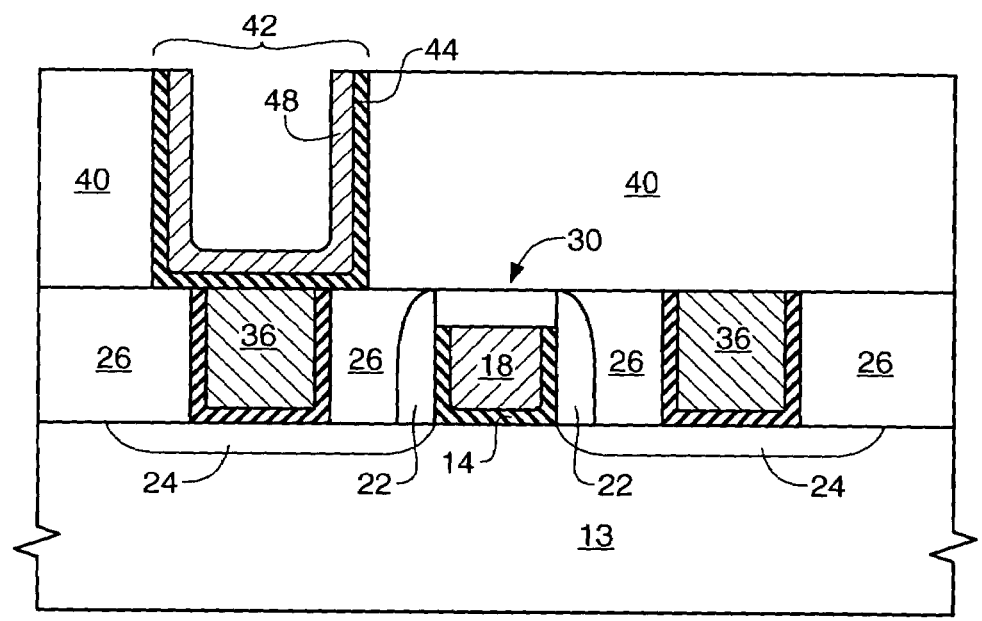

As an alternative or addition to forming the gate 30 and plugs 38 using the steps of non-selectively depositing a seed layer and selectively depositing a dielectric layer, such steps can be used to form one or both electrodes of a capacitor. FIG. 9 illustrates that a third oxide 40 is deposited over the second oxide 26 and a container 42 is defined from the third oxide 40. In this example, defining the container 42 comprises etching the third oxide 40 as guided by a patterned mask 43, such as a nitride mask. The mask 43 need not be removed immediately after defining container 42, as it can be removed later in the same process that will remove other layers, as detailed below. FIG. 10 shows that a third seed layer 44 is deposited so that it conforms to the underlying surfaces, including lining the container 42. For purposes of explanation, it is assumed that the third seed layer 44 comprises platinum and is deposited by a PVD process. A third dielectric 46 is deposited so that it forms only in regions external to the container 42. Subsequently, a layer of platinum, serving as a first electrode 48 and depicted in FIG. 11, is plated onto the exposed third seed layer 44 using methods known in the art. A subsequent CMP step removes the third dielectric 46, portions of the third seed layer 44 external to the container 42, and the mask 43, yielding the in-process device seen in FIG. 12.

Figure 13:
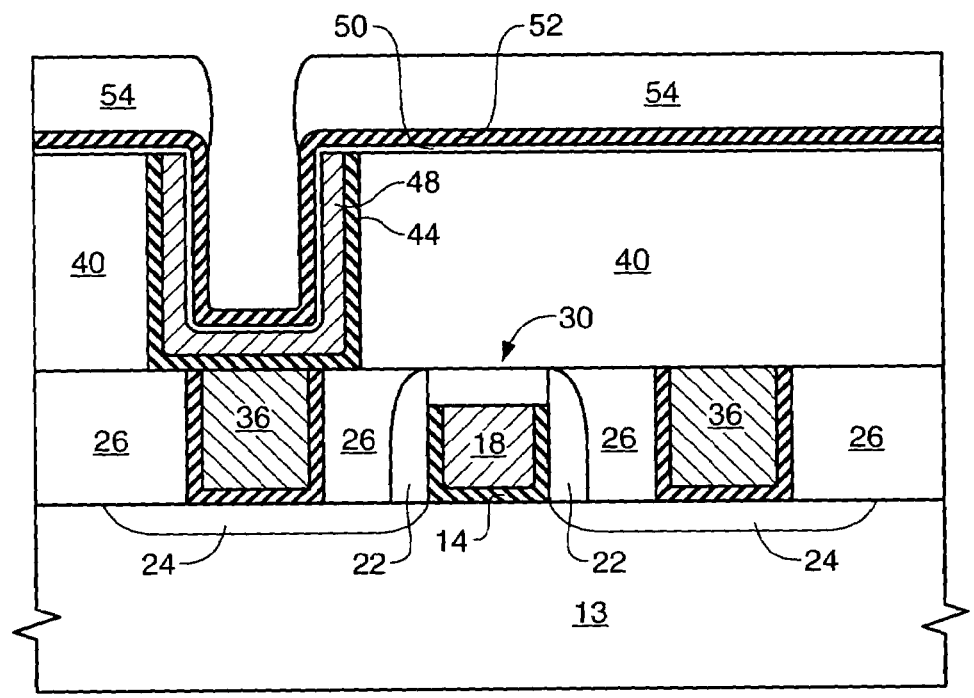
FIGS. 13–15 are cross-sectional views of an in-process semiconductor device depicting still another exemplary process within the scope of the current invention.
Figure 14:
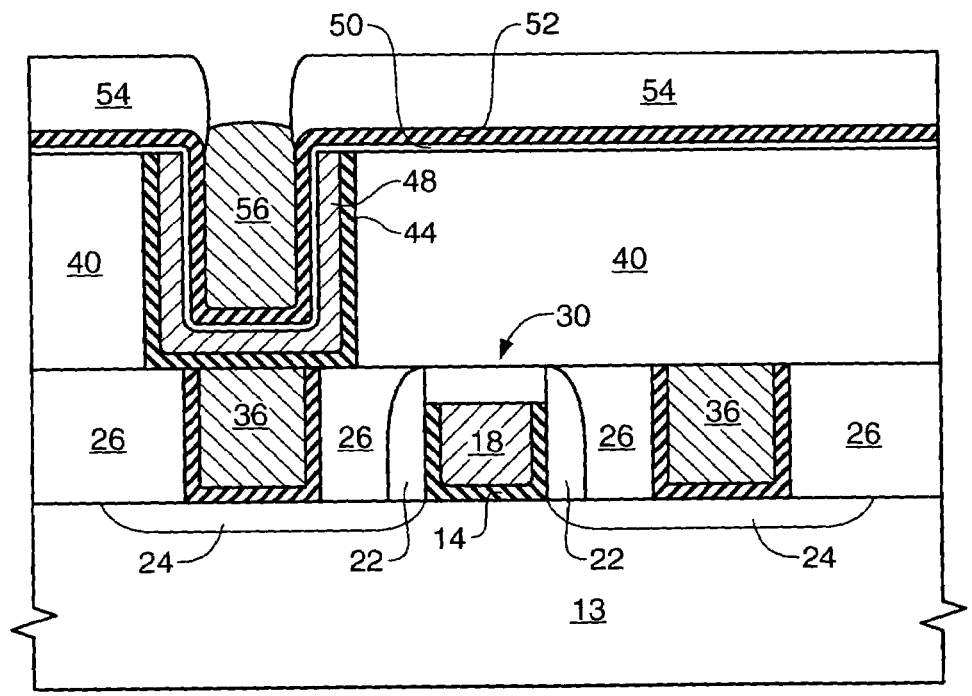
Figure 15:
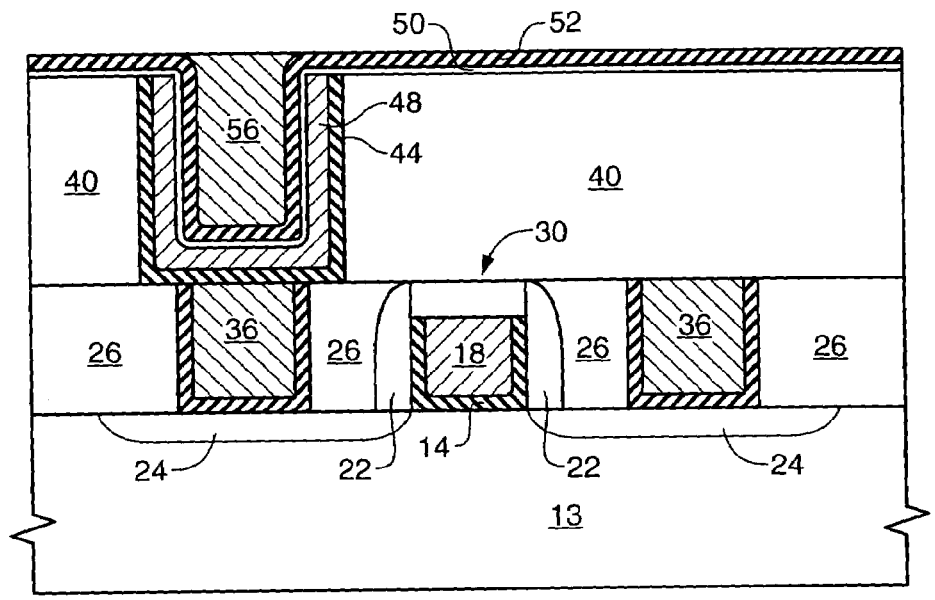

Next, as indicated by FIG. 13, a capacitor dielectric 50 is formed over at least the first electrode 48. A fourth seed layer 52, again comprising platinum, is deposited by way of PVD over the capacitor dielectric 50. A fourth dielectric 54 is selectively deposited onto portions of the fourth seed layer 52 that are outside of the container 42. A subsequent plating process selectively deposits platinum, which serves as a second electrode 56 (FIG. 14). It should be noted that, in many semiconductor circuits, this second electrode serves as a cell plate node that is in electrical communication with a plurality of capacitors. As a result, when performing a CMP step, as has been done in examples discussed above, it may be desirable in this example to stop the CMP step once the fourth dielectric 54 has been removed and retain the fourth seed layer 52 (FIG. 15). This is easily accomplished if the seed layer comprises platinum—a noble metal—which is resistant to CMP.

Figure 16:
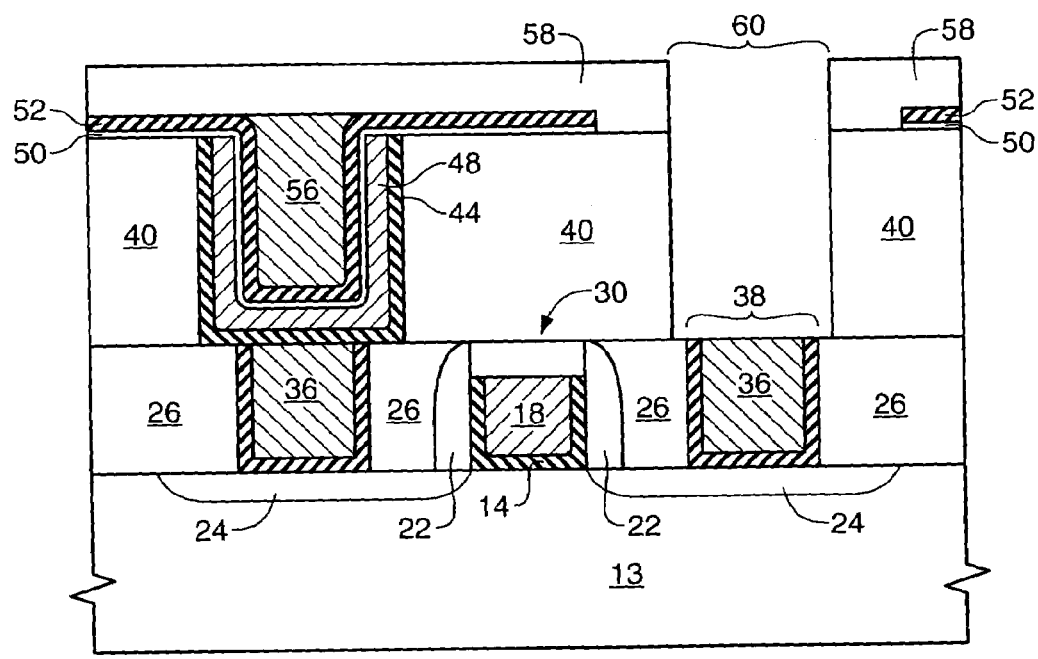
FIGS. 16–19 are cross-sectional views of an in-process semiconductor device depicting one more exemplary process within the scope of the current invention.
Figure 17:
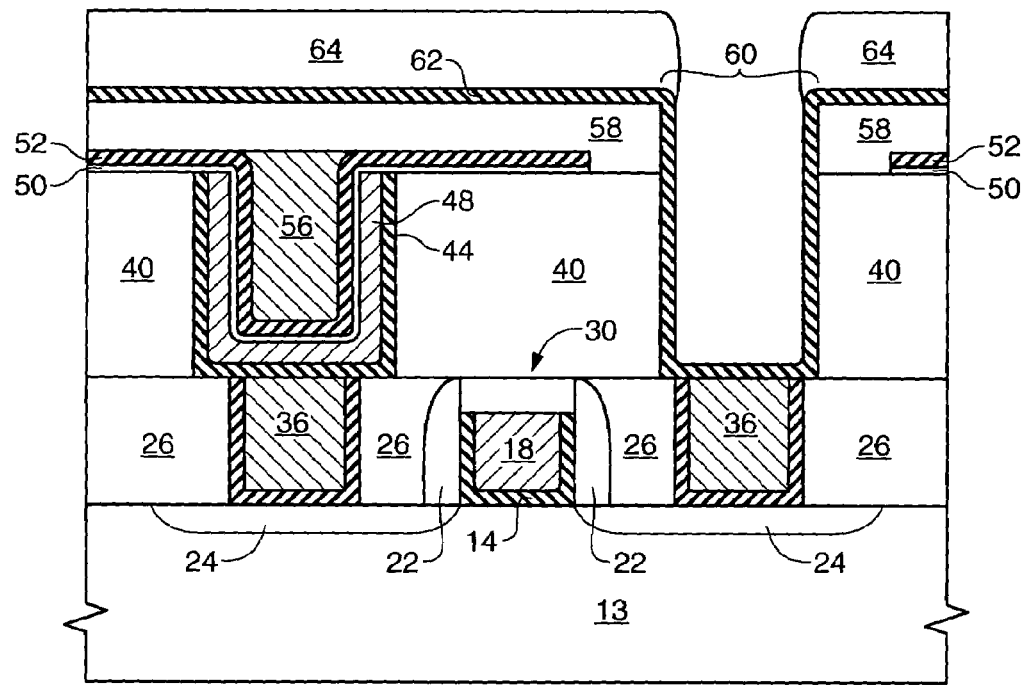
Figure 18:
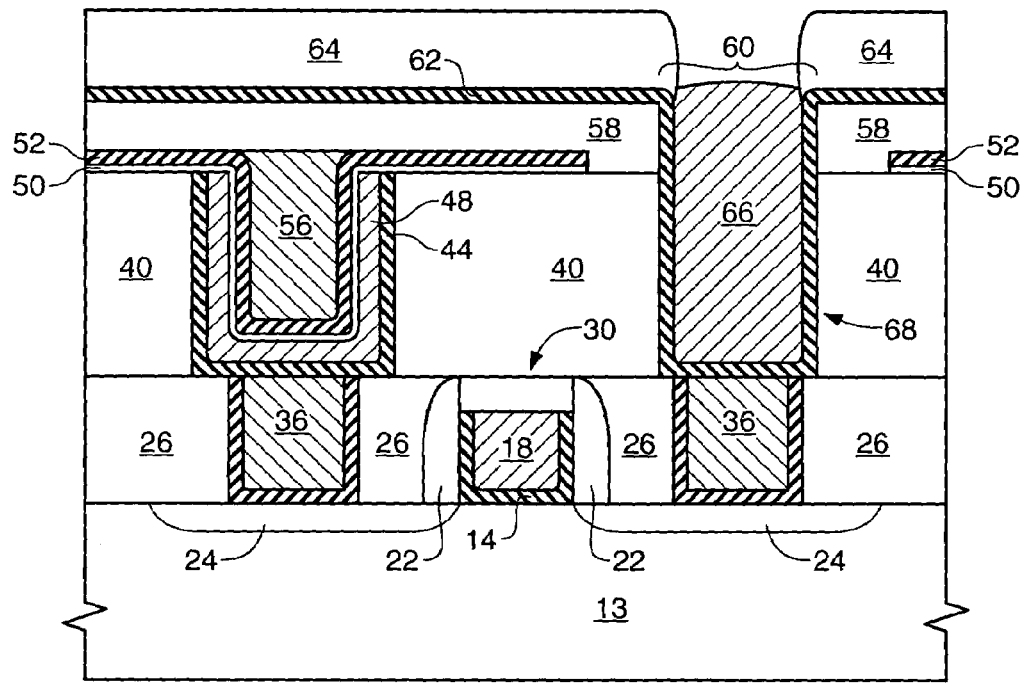

Another stage in which the disclosed process may be used is illustrated beginning with FIG. 16. This stage concerns the formation of a bit line contact. The fourth seed layer 52 and capacitor dielectric 50 are removed from an area above one of the plugs 38, and a fourth oxide 58 is placed in that area as well as areas above the fourth seed layer 52 and capacitor dielectric 50. A contact opening 60 is etched through the fourth oxide 58 and the third oxide 40 down to one of the plugs 38. FIG. 17 demonstrates that a conformal fifth seed layer 62 that lines the contact opening 60 is provided, as is a non-conformal fifth dielectric 64. Accordingly, a subsequent plating process deposits metal 66 only within the contact opening 60 (FIG. 18), thereby forming a bit line contact 68. It should be noted that the plug 36 under bit line contact 68 is not necessary for purposes of this exemplary embodiment: the formation of that plug 36 could be skipped and the bit line contact 68 could be formed so that it extends all the way to the underlying active area 24.

Figure 19:
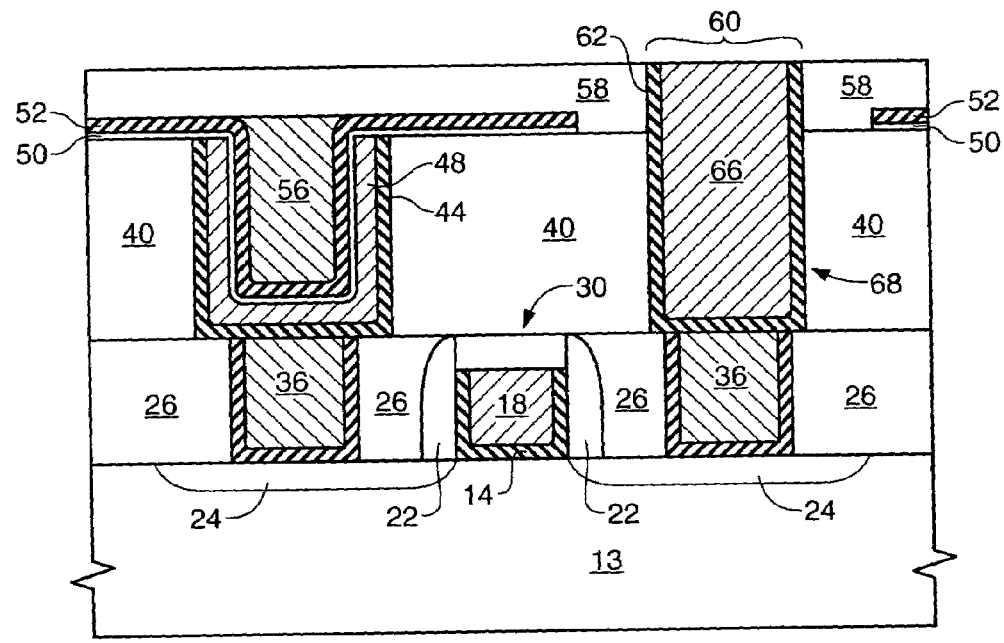
Figure 20:
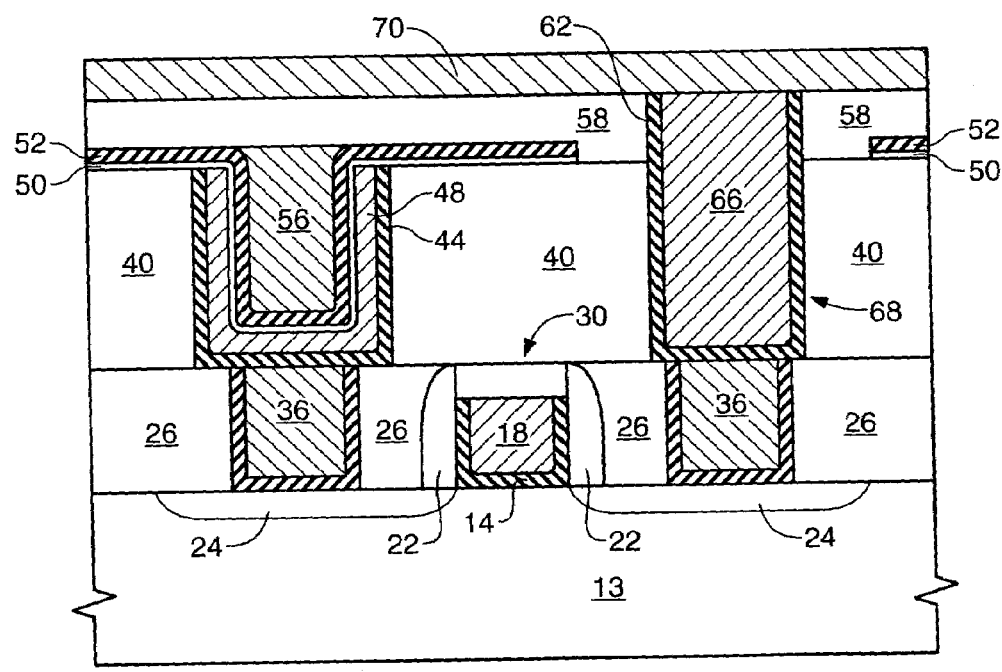
FIG. 20 is a cross-sectional view of an in-process semiconductor device depicting another application of an exemplary process within the scope of the current invention.

Once the fifth dielectric 64 and fifth seed layer 62 have been removed using a process such as CMP (FIG. 19), the bit line itself 70 (FIG. 20) may be provided in a similar manner.

As mentioned above, exemplary embodiments of the current invention include any one or any combination of the stages described above. Further, one of ordinary skill in the art will appreciate that, although exemplary embodiments of this invention have been described above for purposes of illustration, various modifications may be made without departing from the spirit and scope of the invention. For example, materials other than platinum or copper can be provided using the techniques described above. Such other metals include silver, gold, cobalt, nickel, non-metals, non-conductive materials, and in general any material that benefits from a seed layer, as well as combinations of materials.

Further, exemplary embodiments of the current invention are not limited to the plasma process addressed above. Other plasma processes, often referred to as "high density" or "decoupled" plasma processes may be used in embodiments of the current invention. In fact, any deposition process that uses a plasma without applying substantial amounts of capacitively coupled power through the wafer could be used in such embodiments. For instance, embodiments of the current invention may be applied to a plasma process wherein the capacitively coupled power through the wafer is 20% or less than the total power delivered to the chamber.

In addition, plasma process are not the only deposition processes that could be used to provide a masking material outside of the trench. Any process that provides the appropriate non-conformal material could be used. For instance, reacting silane with vaporized hydrogen peroxide results in a gas which condenses as a liquid on a substrate cooled to about 0° C. The condensation is non-conformal, as portions of the liquid on horizontal surfaces are thicker than portions of the liquid on vertical surfaces. A subsequent heat treatment dries the liquid to form $SiO_2$. Given a support surface defining a trench and an ambient temperature during deposition approaching 100° C., it is believed that the non-conformal oxide will deposit only at the top of a trench to the exclusion of the sides and bottom of the trench.

Moreover, in addition to the layers addressed above, other layers may be included during the fabrication process to serve as diffusion barriers or to promote electrical communication. In fact, the presence of a barrier layer highlights the advantages of at least some embodiments of the current invention. Specifically, it is known in the art to deposit a conformal layer of tantalum before depositing a seed layer and plating copper. The tantalum acts as a barrier to copper diffusion. Assuming that copper is plated both within and without the trenches, one skilled in the art must then remove both copper and tantalum from regions outside of the trenches. Further assuming that the unwanted copper and tantalum will be removed by way of CMP, one skilled in the art has a choice of three main types of slurry. A first type is effective against copper but generally ineffective against tantalum; for example, EP-C5001 from Cabot Corporation will remove Cu at 6000 A/minute and will not remove Ta. A second type is effective against tantalum but generally ineffective against copper; EP-C4200A from Cabot corporation, for instance, will remove Ta at 500 A/min and will not remove Cu. A third type works on both copper and tantalum, but the copper removal rate is still relatively low. In general, a low removal rate for copper is considered to be about 1000 A/min or less. As a specific example of this third type of slurry, Cu-10k-2 from Planar Solutions will remove both Cu (at 650 A/min) and Ta (at 800 A/min). The exact chemistry of these slurries are trade secrets of the vendors selling them, but it is believed that the slurries are based on hydrogen peroxide and include different additives.

Given the three types of slurries discussed above, a two-stage CMP process is often chosen, wherein the first type of slurry is initially used to remove the copper and stop on the tantalum. The slurry is then switched to the second type to remove the tantalum layer. The third type of slurry would eventually remove both copper and tantalum without the need to switch chemistries. However, one of ordinary skill in the art would be discouraged from using this type of slurry. Given the amount of copper to be removed from the prior art in-process structure, the amount of time needed for this slurry to complete the CMP process would be unacceptable. Thus, up to now, one of such skill in the art has been faced with either (1) the problems associated with providing and switching between multiple slurry chemistries or (2) the problems associated with one slowly acting slurry.

Exemplary embodiments of the current invention avoid both problems. Such embodiments allow the use of the third type of chemistry. Because there is a relatively low amount of copper to CMP—the seed layer and perhaps some plated copper extending up from the trench—the relatively low copper removal rate is inconsequential. Further, it is believed that the slurry will be effective in removing the self-aligned dielectric mask as well. As a result, the two-step CMP process in the prior art is simplified to a one-step CMP process in exemplary embodiments of the current invention.

Accordingly, the invention is not limited except as stated in the claims.

What is claimed is:

1. A method of providing copper in a trench defined by an oxide, comprising:
   providing a barrier layer over and conformal to said oxide;
   providing a seed layer over and conformal to said barrier layer;
   depositing a mask layer over and non-conformal to said seed layer using process parameters that avoid deposition in said trench;
   plating copper into said trench; and
   removing said mask layer, a portion of said seed layer outside of said trench, and a portion of said barrier layer outside of said trench using chemical mechanical planarization.

2. The method in claim 1, wherein said removing step comprises removing a portion of said copper that extends above said trench.

3. The method in claim 2, wherein said removing step comprises using a common slurry to remove said portion of said barrier layer and said portion of said seed layer.

4. The method in claim 3, wherein said removing step comprises using a common slurry to remove said mask layer, said portion of said barrier layer, and said portion of said seed layer.

5. The method in claim 4, wherein said depositing step comprises exposing said trench; and wherein said plating step comprises plating onto any portion of said seed layer that is exposed by said mask layer.

6. The method of claim 1, wherein depositing the mask layer includes depositing the mask layer on the seed layer above an upper surface of the oxide layer outside the trench such that the trench is free of the mask layer.

7. The method of claim 6, wherein removing said mask layer includes completely removing the mask layer.

8. The method of claim 1, wherein depositing the mask layer includes depositing the mask layer outside the trench such that the trench is free of the mask layer.

9. The method of claim 1, wherein removing said mask layer includes completely removing the mask layer.

10. The method of claim 1, wherein depositing the mask layer includes depositing polymer film.

11. The method of claim 1, wherein depositing the polymer film includes depositing a fluorocarbon polymer film.

12. The method of claim 1, wherein depositing the mask layer includes depositing hydrocarbon film.

13. The method of claim 1, wherein depositing the mask layer includes depositing fluorohydrocarbon film.

14. The method of claim 1, wherein depositing the mask layer includes depositing a dielectric layer.

15. The method of claim 1, wherein depositing the mask layer includes failing to deposit mask material in the trench.

16. The method of claim 15, wherein failing includes providing decreasing isotropic flux of neutrals toward the bottom of the trench.

17. The method of claim 1, wherein depositing a mask layer includes plasma depositing.

18. The method of claim 1, wherein plating copper includes isolating the seed layer from a plating fluid outside the trench.

19. A method of providing copper in a trench defined by an oxide, comprising:
   providing a barrier layer over and conformal to the oxide;
   providing a seed layer over and conformal to the barrier layer;

plasma depositing a mask layer over and non-conformal to the seed layer such that the seed layer is only exposed in the trench;

plating copper only in the trench; and removing the mask layer, a portion of the seed layer outside of the trench, and a portion of the barrier layer outside of the trench using chemical mechanical planarization.

20. The method of claim 19, wherein depositing the mask layer includes depositing a fluorocarbon polymer film.

21. The method of claim 19, wherein depositing the mask layer includes depositing the mask layer using a set of parameters comprising:

a $CH_2F_2$ gas;

a flow rate of the gas ranging from 20–60 sccm;

a pressure ranging from 1 to 40 mTorr;

a source power ranging from 600 W to 1500 W;

a bias power of about 0 W;

a roof temperature of about 140 degree C.; and an outer ring temperature of about 200 degree C.

22. The method in claim 21, wherein plating copper includes depositing copper using a second set of parameters comprising:

a liquid comprising copper sulfate, sulfuric acid, hydrochloric acid, and at least one organic additive;

an anode-cathode distance ranging from 1 to 5 cm;

a flow rate of said liquid ranging from 2 to 7 gallons per minute;

a current ranging from 2 to 8 amps;

a process time ranging from 1 to 7 minutes;

a waveform comprising a selection of:

a pulse waveform, a direct current waveform, and a reverse pulse waveform; and a wafer rotation rate ranging from 20 to 70 rotations per minute.

* * * * *